(12) United States Patent
Kobayashi (10) Patent No.: US 9,185,304 B2
(45) Date of Patent: *Nov. 10, 2015

(54) IMAGE PICKUP APPARATUS AND PROCESSING METHOD FOR RESULT OF IMAGE PICKUP

(71) Applicant: Sony Corporation, Tokyo (JP)

(72) Inventor: Seiji Kobayashi, Tokyo (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/159,616

(22) Filed: Jan. 21, 2014

(65) Prior Publication Data

US 2014/0132785 A1 May 15, 2014

Related U.S. Application Data

(60) Continuation of application No. 13/690,999, filed on Nov. 30, 2012, which is a division of application No. 11/794,996, filed as application No. PCT/JP2005/022603 on Dec. 2, 2005, now Pat. No. 8,345,108.

(30) Foreign Application Priority Data

Jan. 13, 2005 (JP) ................. P2005-006178

(51) Int. Cl.
*H04N 5/235* (2006.01)
*H04N 5/232* (2006.01)
*H04N 5/14* (2006.01)

(52) U.S. Cl.
CPC ............. *H04N 5/2351* (2013.01); *H04N 5/145* (2013.01); *H04N 5/232* (2013.01); *H04N 5/23248* (2013.01); *H04N 5/23251* (2013.01)

(58) Field of Classification Search
USPC .............. 348/208.1, 208.4, 208.12, 362
See application file for complete search history.

(56) References Cited

U.S. PATENT DOCUMENTS

| | | | |
|---|---|---|---|
| 6,255,638 B1 | 7/2001 | Eraluoto et al. | |
| 6,303,923 B1 | 10/2001 | Wadsworth et al. | |
| 6,665,010 B1 * | 12/2003 | Morris et al. | 348/297 |
| 6,765,619 B1 | 7/2004 | Deng et al. | |
| 6,809,769 B1 * | 10/2004 | Yang | 348/308 |
| 6,833,626 B2 | 12/2004 | Kajiwara et al. | |
| 7,030,911 B1 * | 4/2006 | Kubo | 348/221.1 |
| 7,091,469 B2 | 8/2006 | Kossives et al. | |
| 7,158,180 B2 | 1/2007 | Neidrich | |
| 7,583,305 B2 | 9/2009 | McDermott | |

(Continued)

FOREIGN PATENT DOCUMENTS

| | | |
|---|---|---|
| JP | 06-165047 A | 6/1994 |
| JP | 06-261256 A | 9/1994 |

(Continued)

OTHER PUBLICATIONS

European Search Report, EP 05814419, mailed Nov. 5, 2009.

*Primary Examiner* — Jason Flohre
(74) *Attorney, Agent, or Firm* — Lerner, David, Littenberg, Krumholz & Mentlik, LLP (57) ABSTRACT

The present invention is applied to an image pickup apparatus for which, for example, a CMOS solid-state image pickup element is used. One screen image is divided into a plurality of blocks, and a motion is detected for each of the blocks to control the exposure time of the block.

18 Claims, 8 Drawing Sheets

(56) References Cited

U.S. PATENT DOCUMENTS

| | | |
|---|---|---|
| 2002/0105591 A1 | 8/2002 | Nakamura et al. |
| 2003/0020827 A1 | 1/2003 | Bean et al. |
| 2003/0174772 A1* | 9/2003 | Voronov et al. .......... 375/240.06 |
| 2004/0160525 A1 | 8/2004 | Kingetsu et al. |
| 2005/0062853 A1* | 3/2005 | Yagi et al. .................. 348/222.1 |
| 2005/0062871 A1* | 3/2005 | Nishida et al. ................ 348/340 |
| 2005/0128343 A1 | 6/2005 | Murata et al. |
| 2006/0017814 A1 | 1/2006 | Pinto et al. |

FOREIGN PATENT DOCUMENTS

| | | |
|---|---|---|
| JP | 07-038803 A | 2/1995 |
| JP | 07-284006 A | 10/1995 |
| JP | 11-088763 A | 3/1999 |
| JP | 2000-013690 A | 1/2000 |
| JP | 2000-278595 A | 10/2000 |

* cited by examiner

IMAGE PICKUP APPARATUS AND PROCESSING METHOD FOR RESULT OF IMAGE PICKUP

CROSS-REFERENCE TO RELATED APPLICATIONS

The present application is a continuation of U.S. application Ser. No. 13/690,999, filed on Nov. 30, 2012, which is a divisional of U.S. application Ser. No. 11/794,996, filed on Oct. 15, 2007, now U.S. Pat. No. 8,345,108, issued on Jan. 1, 2013, which application is a national phase entry under 35 U.S.C. §371 of International Application No. PCT/JP2005/022603 filed Dec. 2, 2005, which claims priority from Japanese Application No. P2005-006178 filed Jan. 13, 2005, all of which are incorporated herein by reference.

BACKGROUND OF THE INVENTION

1. Technical Field

This invention relates to an image pickup apparatus and a processing method for a result of image pickup and can be applied, for example, to an image pickup apparatus for which a CMOS solid-state image pickup element is used. The present invention makes it possible to further enhance the picture quality in comparison with conventionally available picture quality in regard to control of the exposure time by means of an electronic shutter by dividing a screen image into a plurality of blocks, performing motion detection and controlling the exposure time for each of the blocks.

2. Background Art

Conventionally, an image pickup apparatus is configured such that the charge accumulation time of an image pickup element is controlled by an electronic shutter to control the exposure time so that, also in a case when an image of an image pickup object which is moving quickly is picked up, an image pickup result having no image shake can be acquired. Regarding such control by an electronic shutter as just described, a method is proposed, for example, in Japanese Patent Laid-open No. Hei 6-165047 and Japanese Patent Laid-open No. Hei 6-261256 wherein a motion of an image pickup object is detected by a system controller and the exposure time is controlled based on the motion detection result together with execution of gain control of AGC (Auto Gain Control) and control by ALC (Auto Light Control).

However, conventional control of the exposure time by an electronic shutter is performed such that, where the exposure time is varied equally for all of pixels which form one screen image to vary the exposure time based on a motion of a portion of the screen image, the exposure time is reduced also regarding a stationary portion of the screen image such as a background or the like. Therefore, in such a case as just described, there is a problem that the S/N ratio at such a stationary portion as just described deteriorates and the picture quality deteriorates as much.

Conversely, there is another case wherein any motion cannot be detected in regard to a small object. In this case, since it is difficult to control the exposure time appropriately, an image of the small object is picked up in a blurred state. Therefore, also in this instance, there is a problem that the picture quality deteriorates.

DISCLOSURE OF INVENTION

The present invention has been made taking the foregoing into consideration and proposes an image pickup apparatus and a processing method for an image pickup result by which the picture quality can be enhanced significantly when compared with conventional picture quality with regard to control of the exposure time by an electronic shutter.

In order to solve the subject described above, the present invention is applied to an image pickup apparatus including: image pickup means having an image pickup surface formed thereon from pixels arranged in a matrix for outputting a result of image pickup of an optical image formed on the image pickup surface; motion detection means for detecting a motion amount in the result of the image pickup for each of blocks into which the image pickup surface is divided in a horizontal direction and/or a vertical direction; control means for controlling exposure time of the image pickup means for each of the blocks based on a result of the detection by the motion detection means such that the exposure time decreases as the motion amount increases; and signal level correction means for correcting and outputting, for each of the blocks, a signal level of the result of the image pickup which varies in accordance with control of the exposure time.

According to the configuration of the present invention, where it is applied to an image pickup apparatus including: image pickup means having an image pickup surface formed thereon from pixels arranged in a matrix for outputting a result of image pickup of an optical image formed on the image pickup surface; motion detection means for detecting a motion amount in the result of the image pickup for each of blocks into which the image pickup surface is divided in a horizontal direction and/or a vertical direction; and control means for controlling exposure time of the image pickup means for each of the blocks based on a result of the detection by the motion detection means such that the exposure time decreases as the motion amount increases, the exposure time can be controlled in response to a motion for each of the blocks. Consequently, regarding a stationary background, the exposure time can be set long to prevent degradation of the S/N ratio, but regarding a portion which involves some motion, the exposure time can be set short to prevent a blurred state. Further, by detecting a motion for each of the blocks, a motion can be detected also from a small object, and as a result, a blurred state can be prevented also with regard to such a small object as described above. Consequently, regarding control of the exposure time by an electronic shutter, the picture quality is enhanced significantly in comparison with conventionally available picture quality. Further, since the signal level correction means for correcting and outputting, for each of the blocks, a signal level of the result of the image pickup which varies in accordance with control of the exposure time is provided, a variation of the signal level between the blocks which varies in accordance with control of the exposure time for each of the blocks in this manner can be prevented.

Further, the present invention is applied to a processing method for a result of image pickup, including: a motion detection step of detecting a motion amount in a result of image pickup by image pickup means for each of blocks into which an image pickup surface of the image pickup means is divided in a horizontal direction and/or a vertical direction; a control step of controlling exposure time of the image pickup means for each of the blocks based on a result of the detection at the motion detection step; and a signal level correction step of correcting and outputting, for each of the blocks, a signal level of the result of the image pickup which varies in accordance with control of the exposure time.

Consequently, according to the configuration of the present invention, a processing method for a result of image pickup by which the picture quality can be enhanced significantly in comparison with conventionally available picture quality regarding control of the exposure time by an electronic shutter can be provided.

According to the present invention, the picture quality can be enhanced significantly in comparison with conventionally available picture quality regarding control of the exposure time by an electronic shutter.

BEST MODE FOR CARRYING OUT THE INVENTION

In the following, embodiments of the present invention are described in detail suitably with reference to the drawings.

(1) Configuration of the First Embodiment

Figure 1:
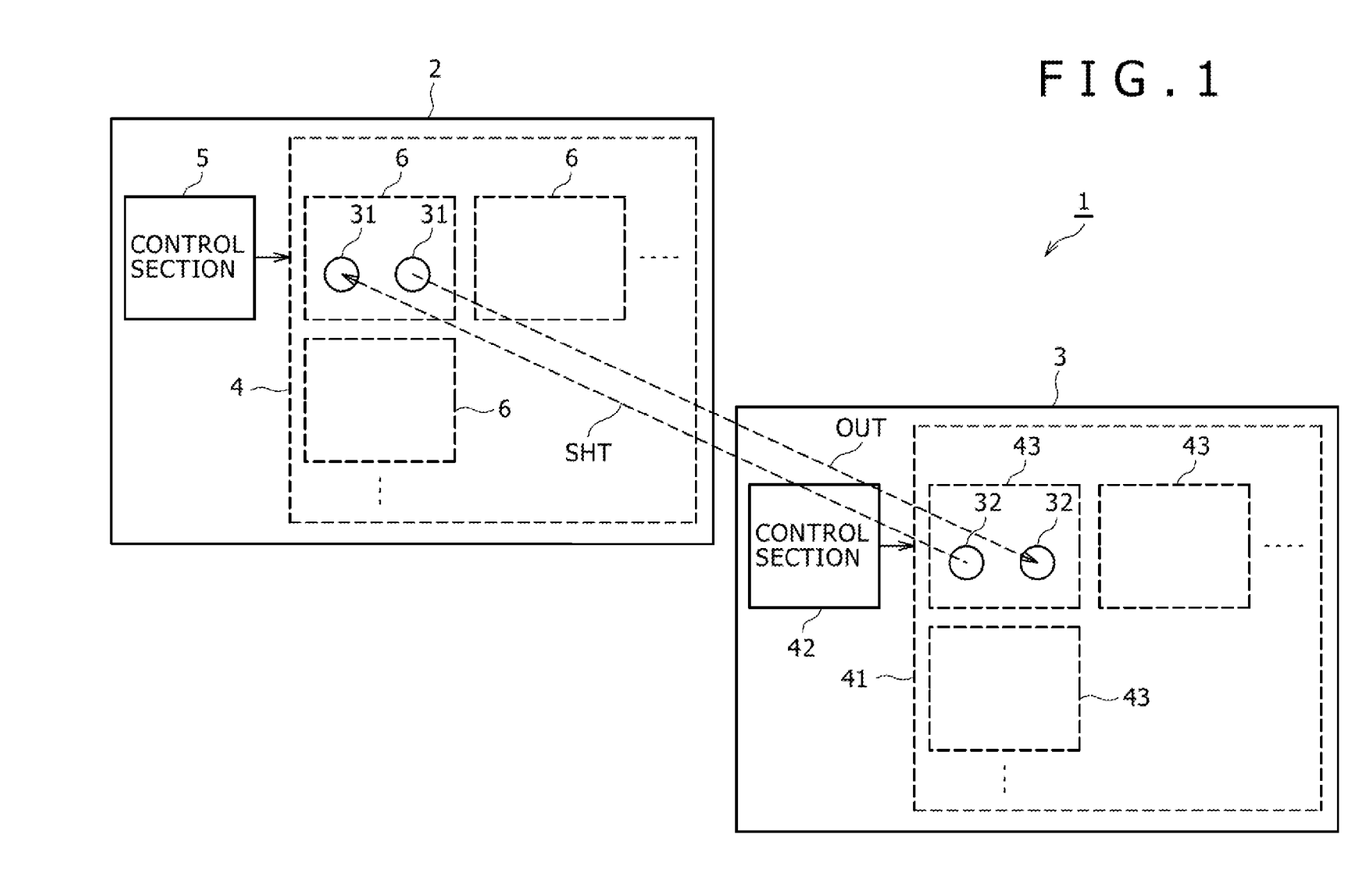
FIG. 1 is a block diagram showing a general configuration of an integrated circuit according to an embodiment of the present invention.

FIG. 1 is a block diagram showing an integrated circuit applied to an image pickup apparatus according to a first embodiment of the present invention. The image pickup apparatus according to the present embodiment forms a desired optical image on an image pickup surface of the integrated circuit 1 by automatic iris control and automatic focusing control by a controller for which a lens not shown is used and outputs a result of the image pickup of the optical image.

Here, the integrated circuit 1 is an integrated circuit including an image pickup element and is formed by packaging a laminated object of a sensor chip 2 and a logic chip 3.

Here, the sensor chip 2 is a semiconductor chip of an image pickup element which outputs a result of image pickup in accordance with an XY address method, and, in the present embodiment, a CMOS solid-state image pickup element is applied as the image pickup element. The sensor chip 2 includes an image pickup section 4 and a control section 5 for controlling operation of the image pickup section 4.

Here, the image pickup section 4 has an image pickup surface formed by arranging pixels in a matrix and outputs a result of image pickup of an optical image formed on the image pickup surface. In the image pickup section 4, the pixels arranged in a matrix are divided equally in a horizontal direction and a vertical direction, and the image pickup surface is divided into a plurality of pixel blocks 6 thereby. A peripheral circuit relating to pixels which belong to each of the pixel blocks 6 is provided individually for the pixel block 6, and the pixel blocks 6 are individually formed such that a result of image pickup thereof is outputted. Therefore, the sensor chip 2 outputs the results of image pickup by the plural pixel blocks 6 simultaneously and parallelly.

Figure 2:
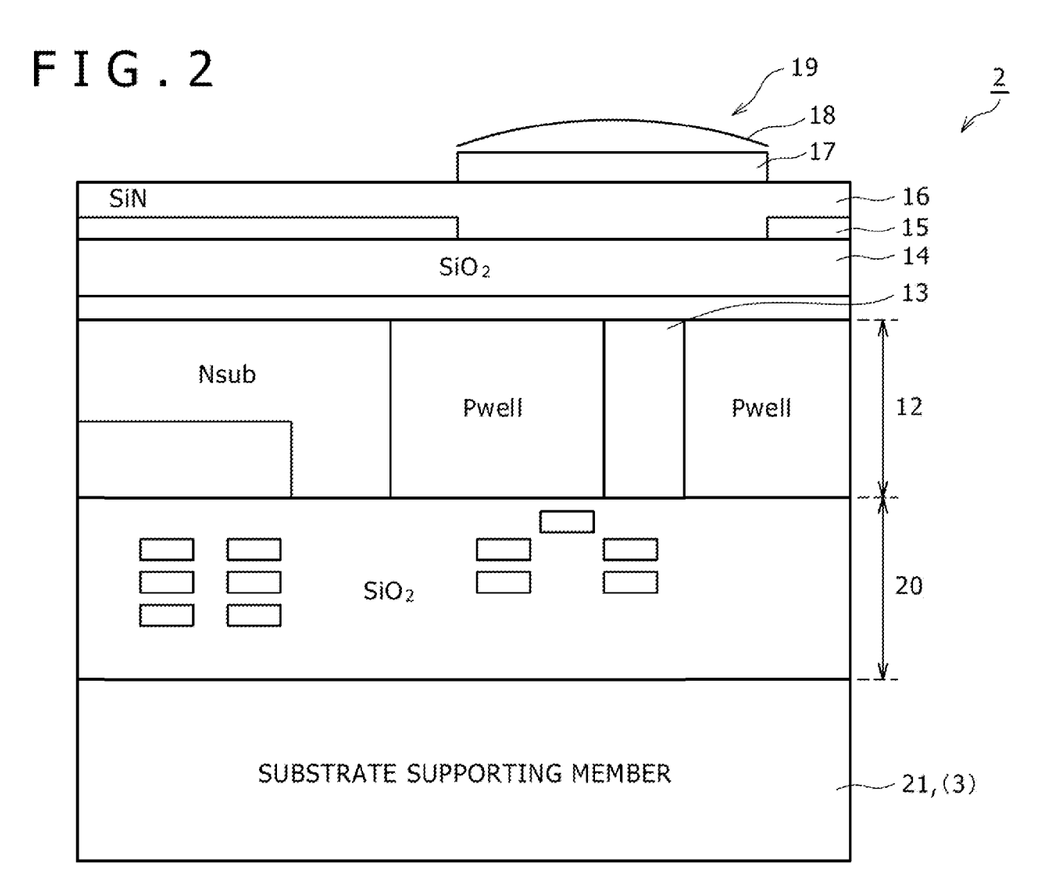
FIG. 2 is a sectional view of a sensor chip of the integrated circuit in FIG. 1.

As shown partly in section in FIG. 2, in the sensor chip 2, an element layer 12 is formed from a silicon (Si) layer having a thickness of approximately 10 to 20 [μm] and a light reception element 13 is formed on the element layer 12. Further, a silicon dioxide ($SiO_2$) film 14, a light blocking film 15, a silicon nitride film (SiN) 16, a color filter 17, and a micro lens 18 are successively laminated as an upper layer with respect to a portion corresponding to the light reception element 13, and a pixel 19 is formed thereby. Further, the peripheral circuits of the pixel blocks 6, the control section 5 and a wiring layer 20 for wiring the peripheral circuits and the control section 5 are formed as a lower layer with respect to the element layer 12, and a substrate supporting member 21 for supporting the entirety is provided on the lower layer side of the wiring layer 20. Consequently, in the sensor chip 2, the wiring layer 20 is disposed on the side opposite to that of the image pickup surface and the peripheral circuits, control section 5 and so forth are provided. Thus, the sensor chip 2 is configured such that decrease of the numerical aperture can be avoided effectively also in a case wherein peripheral circuit and so forth are provided individually for the pixel blocks 6. Further, the sensor chip 2 is formed such that various constraints where the wiring layer 20 is formed on the image pickup surface side are cancelled and the degree of freedom in wiring can be increased significantly.

It is to be noted that the sensor chip 2 is formed in such a manner that, since the wiring layer 20 is formed on the side opposite to that of the image pickup surface, a semiconductor substrate having a small thickness is processed from the wiring layer 20 side to form the light reception element 13 and circuit elements of the peripheral circuits and then the wiring layer 20 and substrate supporting member 21 are successively formed on the semiconductor substrate, and thereafter, the element layer 12 is completed by reversing and polishing the semiconductor substrate using a CMP and the light blocking film 15, silicon nitride film (SiN) 16, color filter 17 and micro lens 18 are formed successively.

Figure 3:
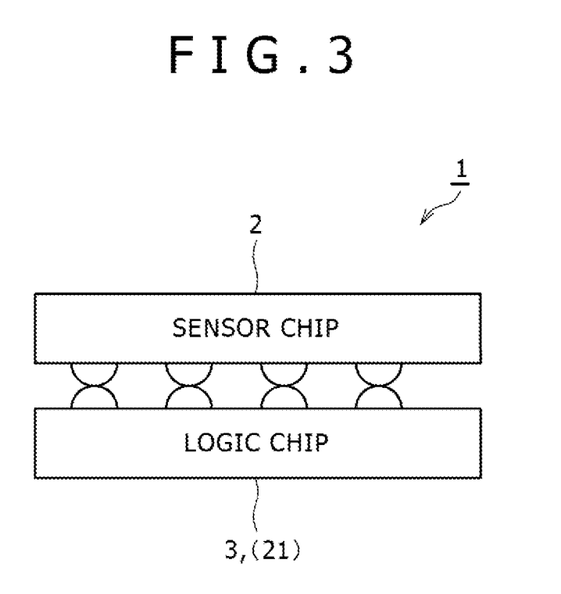
FIG. 3 is a side elevational view illustrating a lamination structure of the sensor chip and a logic chip.

As shown in FIG. 3, in the sensor chip 2, the logic chip 3 is allocated to the substrate supporting member 21, and the sensor chip 2 is electrically connected to and supported on the logic chip 3 by fine projection electrodes 31 formed on the wiring layer 20 side and fine projection electrodes 32 formed on the logic chip 3. The fine projection electrodes 32 are hereinafter referred to as micro bumps.

Here, the logic chip 3 is an integrated circuit including a signal processing circuit for processing a result of image pickup from the sensor chip 2, and, in the present embodiment, the signal processing circuit is formed from a pulse production section 41 for controlling the exposure time of the image pickup section 4 provided on the sensor chip 2 and a control section 42 for outputting various timing signals to the pulse production section 41.

Here, in the pulse production section 41, pulse production blocks 43 individually corresponding to the pixel blocks 6 of the sensor chip 2 are provided. The pulse production blocks 43 are individually connected to the pixel blocks 6 corresponding to the micro bumps 31 and 32 so that the exposure time of the corresponding pixel blocks 6 is controlled. Consequently, the integrated circuit 1 is formed such that results of image pickup from the plural pixel blocks 6 can be outputted simultaneously and parallelly and the exposure time periods of the pixel blocks 6 can be individually controlled by the pulse production blocks 43.

Figure 4:
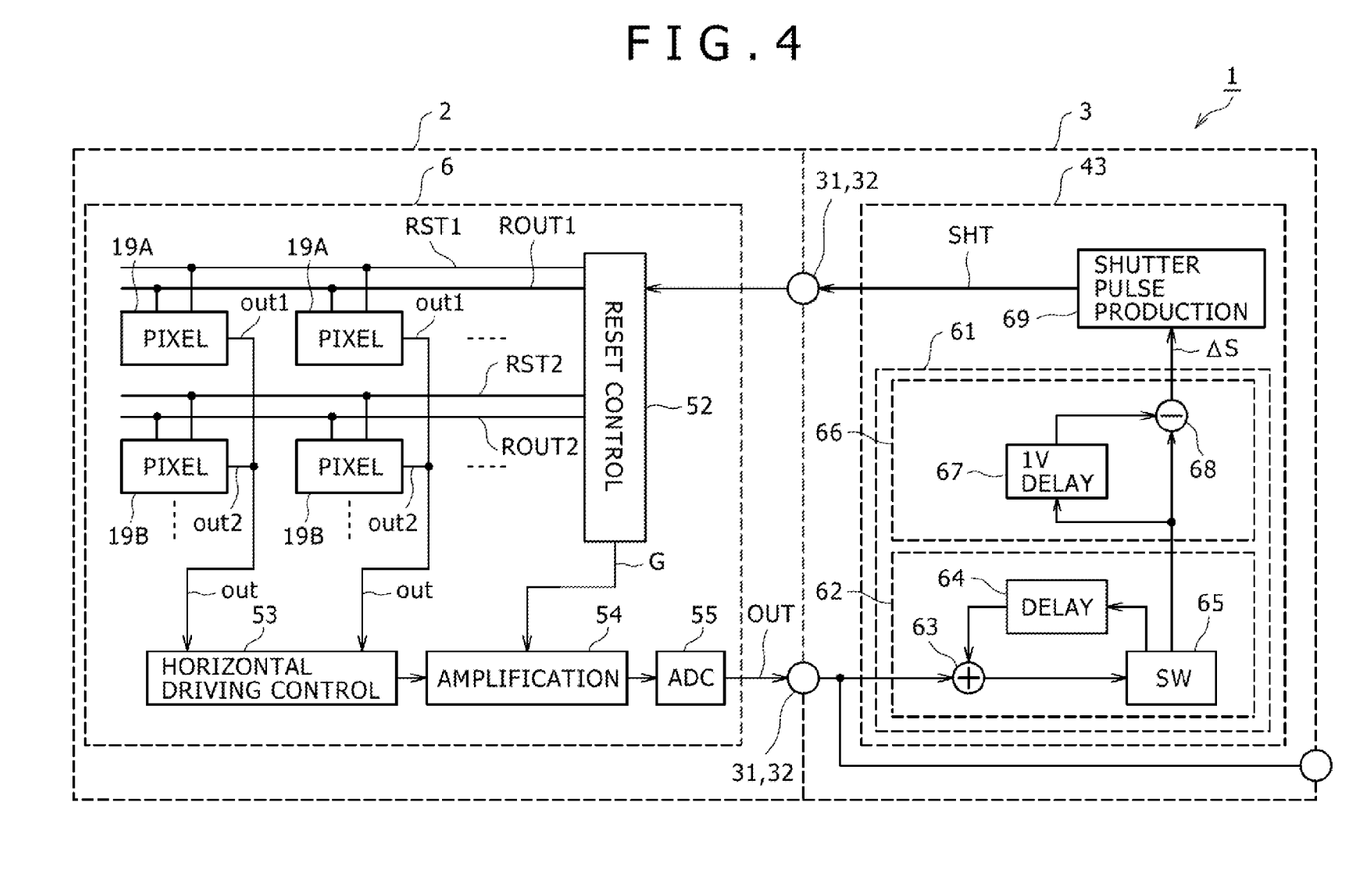
FIG. 4 is a block diagram showing a detailed configuration of the integrated circuit of FIG. 1.

FIG. 4 is a block diagram showing the pixel block 6 and pulse production block 43. Here, in the pixel block 6, pixels 19A and 19B placed successively in a horizontal direction are connected to a reset control circuit 52 through a common gate line. Further, the pixels 19A and 19B placed successively in a vertical direction are connected to each other through a common signal line and are connected to a horizontal driving control circuit 53. The pixels 19A and 19B perform an optoelectric conversion process for incoming light to accumulate electric charge and then discharge the accumulated electric charge in accordance with reset pulses RST1 and RST2 outputted from the reset control circuit 52. Further, the pixels 19A and 19B convert the accumulated electric charge into a voltage in accordance with readout pulses ROUT1 and ROUT2 outputted from the reset control circuit 52 and output the resulting voltage to the signal line. Consequently, in the pixel block 6, by control of the reset control circuit 52, the electric charge accumulation time is varied to vary the exposure time and a result of the image pickup is outputted in a unit of a line to the horizontal driving control circuit 53.

Figure 5:
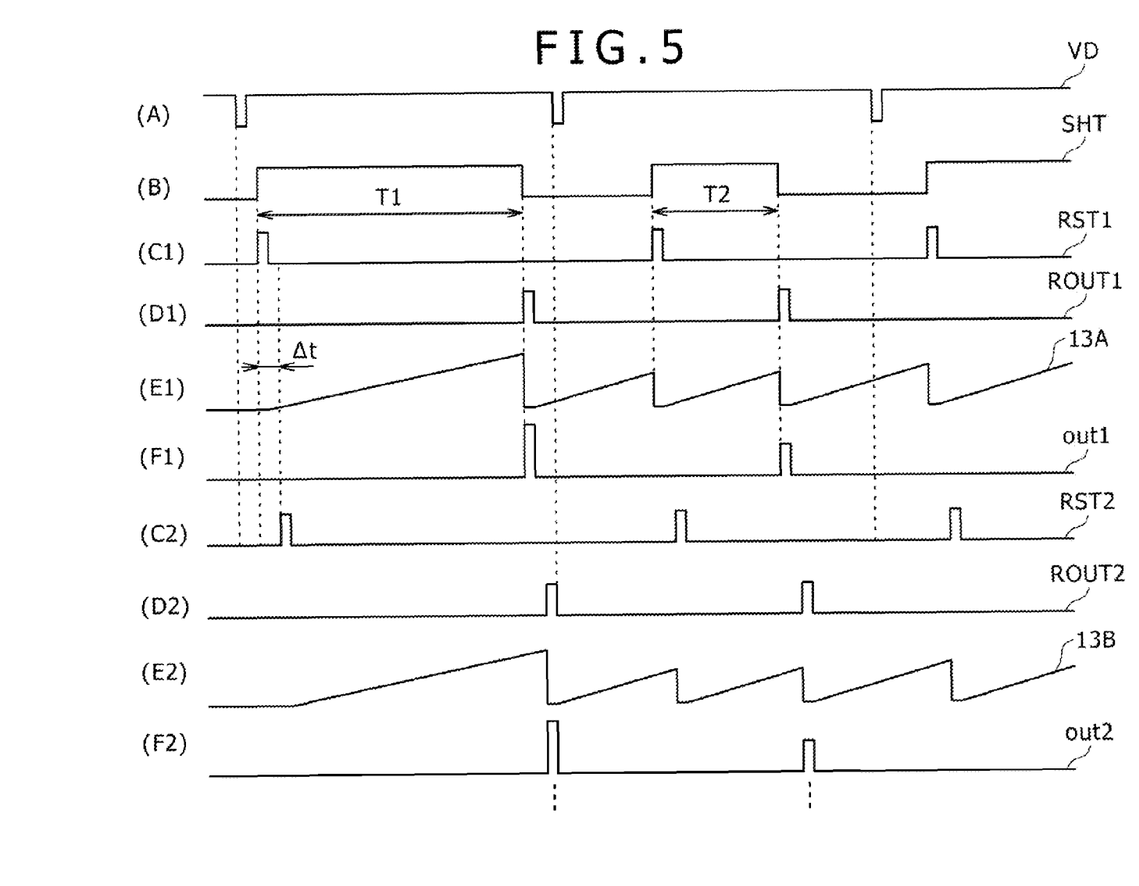
FIG. 5 is a timing chart illustrating operation of a pixel block of FIG. 4.
Figure 6:
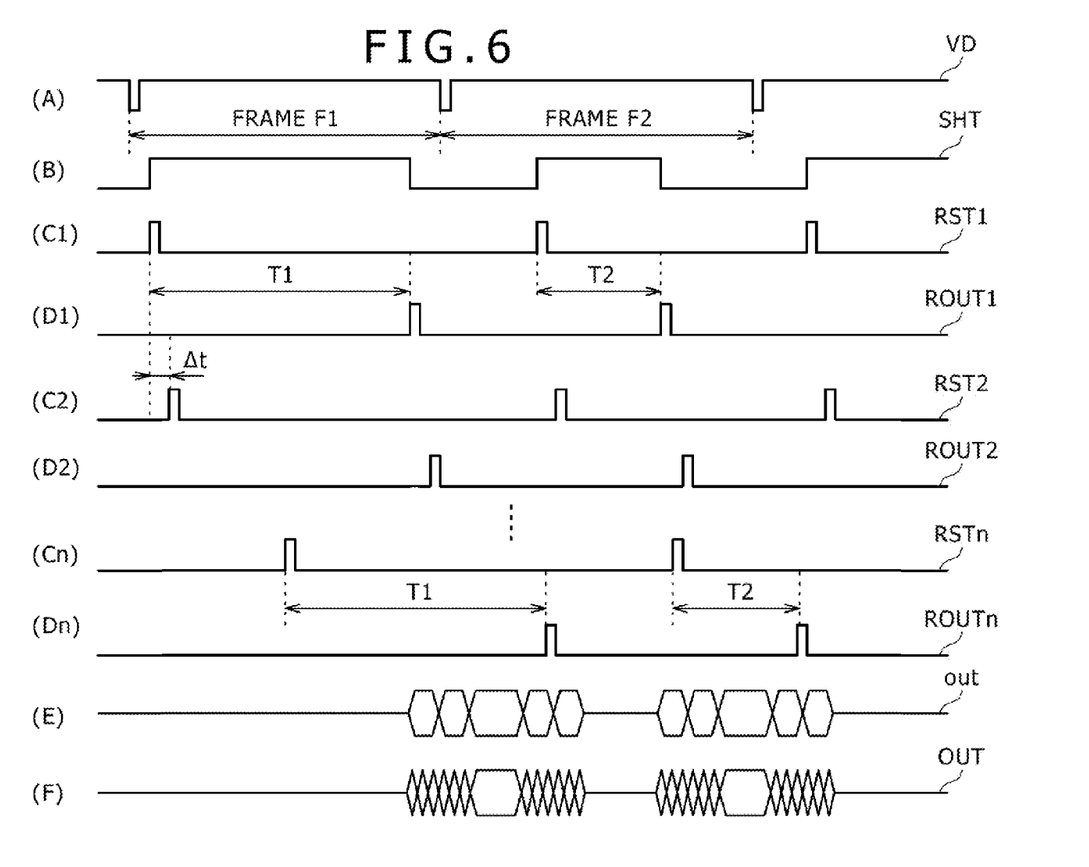
FIG. 6 is a timing chart illustrating control of the exposure time of pixels.

The reset control circuit 52 resets operation in accordance with a vertical synchronizing signal VD outputted from the control section 5 as shown in (A) of FIG. 5 and (A) of FIG. 6. Then, the reset control circuit 52 causes the reset pulse RST1 to rise at a timing of a rising edge of a shutter pulse SHT (refer to (B) of FIG. 5 and (B) of FIG. 6) outputted from a pulse production block 43 (refer to (C1) of FIG. 5 and (C1) of FIG. 6, and causes a readout pulse ROUT1 to rise at a timing of a falling edge of the shutter pulse SHT (refer to (D1) of FIG. 5 and (D1) of FIG. 6).

The reset control circuit 52 outputs the reset pulse RST1 and the readout pulse ROUT1 generated with reference to the shutter pulse SHT to the pixel 19A on the top line. Further, the reset control circuit 52 successively delays the reset pulse RST1 and the readout pulse ROUT1 by delay time Δt corresponding to the number of lines which form the pixel blocks 6 to successively generate reset pulses RST2, ..., and RSTn, and readout pulses ROUT2, ..., and ROUTn relating to the pixels 19B, ... of the remaining lines (refer to (C2) and (D2) of FIG. 5, and (C2), (D2), (Cn) and (Dn) of FIG. 6) and outputs the reset pulse RST2 and the readout pulse ROUT2, ... to the pixels 19B, ... of the other lines.

Consequently, the reset control circuit 52 sets such that the periods T1 and T2 from a rising edge to a falling edge of the shutter pulse SHT are set as exposure time periods for the pixels 19A and 19B. Further, the reset control circuit 52 controls operation of the pixels 19A and 19B such that the accumulated electric charge (refer to (E1) and (E2) of FIG. 5) accumulated in the pixels 19A and 19B is outputted as a result of pickup image to the signal lines in a unit of a line at a timing of an end of the exposure time (refer to (F1) and (F2) of FIG. 5).

Further, the reset control circuit 52 outputs a gain control signal G for an amplification circuit 54 in accordance with the exposure time based on the shutter pulse SHT, and then corrects the signal level of a result of image pickup which varies in accordance with control of the exposure time based on the shutter pulse SHT.

Consequently, results of image pickup of the pixels 19A, 19B, ... placed successively in a vertical direction are successively outputted to the signal lines by time division (refer to (E) of FIG. 6). The horizontal driving control circuit 53 time division multiplexes and outputs the results of image pickup outputted from the pixels 19A and 19B to the signal lines in a unit of a line in such a manner as described above (refer to (F) of FIG. 6).

The amplification circuit 54 varies the gain in accordance with the gain control signal G outputted from the reset control circuit 52, and amplifies and outputs the result of image pickup outputted from the horizontal driving control circuit 53. Consequently, the integrated circuit 1 corrects the signal level of the result of image pickup which varies in accordance with control of the exposure time and outputs the result of image pickup of the corrected signal level.

An analog/digital conversion circuit (ADC) 55 performs an analog/digital conversion process for the output signal of the amplification circuit 54 and outputs image data OUT according to a result of the process to the corresponding pulse production block 43 of the logic chip 3. Consequently, in the present embodiment, the peripheral circuits of the pixels 19A and 19B belonging to the pixel blocks 6 are formed from the reset control circuit 52, horizontal driving control circuit 53, amplification circuit 54 and analog/digital conversion circuit 55.

Consequently, the integrated circuit 1 is configured such that the image pickup results OUT by the pixels 19A and 19B are outputted simultaneously and parallelly from the pixel blocks 6 in such a manner that the image pickup results OUT are outputted from the pixel blocks 6 in accordance with an order of raster scanning and the exposure time periods by the electronic shutter are varied individually by the pixel blocks 6 under the control of the corresponding pulse production block 43, and variations of the signal levels in the image pickup results OUT by variation of the speed of the exposure time are corrected individually in the pixel blocks 6.

The pulse production block 43 detects a motion amount of the result of the image pickup outputted from the corresponding pixel blocks 6 by means of the motion amount detection circuit 61 and varies and outputs the shutter pulse SHT in accordance with a result of the motion amount detection.

In particular, in the motion amount detection circuit 61, an averaging circuit 62 averages results of image pickup outputted from the corresponding pixel blocks 6 in a unit of a frame. In particular, the averaging circuit 62 cumulatively adds the results of image pickup outputted from the corresponding pixel blocks 6 by means of a summing circuit 63 and a delay circuit 64, and outputs a result of the summation to a frame difference calculation circuit 66 for each of frames and initializes the sum value under the control of a switch circuit 65 provided at an output stage of the summing circuit 63. Consequently, the motion amount detection circuit 61 cumulatively adds the results of image pickup in a unit of a frame and then calculates an average value of the results of image pickup from the pixel blocks 6.

The frame difference calculation circuit 66 delays the output value of the averaging circuit 62 by a period of time of one frame by means of the delay circuit (1V delay) 67. Further, the frame difference calculation circuit 66 subtracts the output value of the delay circuit 67 from the output value of the averaging circuit 62 by means of a subtraction circuit 68 to calculate an interframe difference value ΔS. Consequently, the motion amount detection circuit 61 calculates the motion amount approximately based on the interframe difference value ΔS.

The shutter pulse production circuit 69 produces the shutter pulse SHT in accordance with the result of motion amount detection obtained in such a manner as described above by the motion amount detection circuit 61. In particular, the shutter pulse production circuit 69 produces the shutter pulse SHT such that, if the interframe difference value ΔS outputted from the motion amount detection circuit 61 increases, then the period of time of a rising edge of the shutter pulse SHT is reduced as much. Consequently, the shutter pulse SHT is produced such that, if the motion amount increases, then the exposure time reduces as much.

In the process, the shutter pulse production circuit 69 delays, if the interframe difference value ΔS outputted from the motion amount detection circuit 61 increases, the timing of a rising edge of the shutter pulse SHT as much, and advances the timing of a falling edge of the shutter pulse SHT by the amount by which the timing of the rising edge is delayed. Consequently, the shutter pulse production circuit 69 performs setting such that, even if the shutter speed is varied, the timing of the center of the exposure time in the pixel blocks 6 does not vary so that the phase of the shutter pulse SHT does not vary by a great amount among the pixel blocks 6. It is to be noted that this makes the time from a rising edge to a next rising edge of the shutter pulse SHT one-half the vertical synchronization period at the shortest. Accordingly, the reset control circuit 52 is configured such that the reset pulse RST1 and the readout pulse ROUT1 are produced from the shutter pulse SHT and are successively delayed to produce the reset pulses RST2, . . . and the readout pulses ROUT2, . . . for the lines, and then the reset pulses RST1, RST2, . . . and the readout pulses ROUT1, ROUT2, . . . are outputted individually within periods of the front half and the rear half of the vertical synchronization period.

Figure 7:
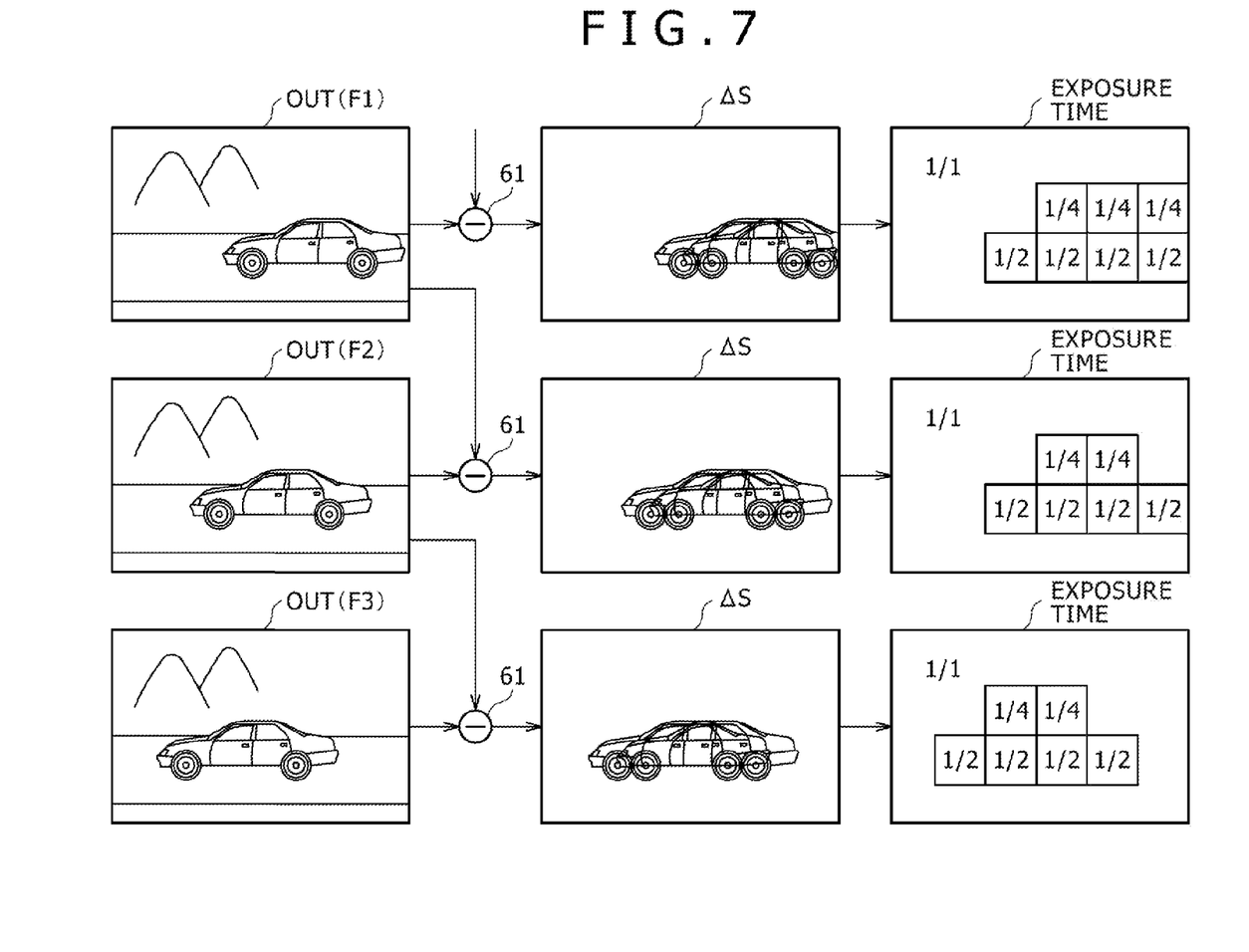
FIG. 7 is a view illustrating a concept of control of the exposure time of blocks.

Consequently, the integrated circuit 1 sets the shutter speed shorter only at locations at which a motion is detected from image pickup results OUT(F1), OUT(F2) and OUT(F3) successively obtained by the sensor chip 2 in accordance with the interframe difference values ΔS of the results of image pickup OUT(F1), OUT(F2) and OUT(F3) as seen in FIG. 7. Consequently, degradation of the S/N ratio at a stationary portion is avoided effectively thereby to prevent a blurred state of a moving image pickup object. Further, also in a case wherein the image pickup object which exhibits a motion is a small object, the shutter speed of the portion relating to the small object is set shorter thereby to prevent a blurred state with certainty. It is to be noted that, in FIG. 7, the exposure time of the pixel blocks with reference to a case wherein the exposure time is not set shorter at all is indicated by a fraction.

Then, the integrated circuit 1 accumulates the image pickup results OUT outputted simultaneously and parallelly from the pixel blocks 6 in such a manner as described above into an image memory provided in the sensor chip 2 and multiplexes the image pickup results OUT in accordance with an order of raster scanning and then outputs the multiplexed results in a single series.

Consequently, in the present embodiment, the pixels 19A and 19B, reset control circuit 52 and horizontal driving control circuit 53 form image pickup means for outputting a result of image pickup of an optical image formed on an image pickup surface, and the motion amount detection circuit 61 forms motion detection means for detecting a motion amount of the result of the image pickup for each of blocks formed by dividing the image pickup surface in a horizontal direction and/or a vertical direction. Further, the shutter pulse production circuit 69 forms control means for controlling the exposure time of the image pickup means for each of the blocks, based on a result of the detection by the motion detection means such that the exposure time reduces as the motion amount of the block increases, and the reset control circuit 52 and the amplification circuit 54 form signal level correction means for correcting and outputting, for each of the blocks, the signal level of the result of the image pickup which varies by control of the exposure time.

(2) Operation of the First Embodiment

In the image pickup apparatus (FIG. 1) having the configuration described above, an optical image is formed on the image pickup surface of the integrated circuit 1 through the lens and a result of the image pickup of the optical image is acquired by and outputted from the integrated circuit 1. In the process of the integrated circuit 1, in the integrated circuit 1 (FIGS. 2 and 4), the image pickup surface is formed by disposing the pixels 19A and 19B of the light reception element 13 in a matrix, and image pickup results OUT are obtained from the pixel blocks 6 formed by equally dividing the image pickup surface in a horizontal direction and a vertical direction.

In particular, in the pixel blocks 6, the readout pulses ROUT1, ROUT2, . . . whose timings are successively shifted on the lines are outputted from the reset control circuit 52, and image pickup results out1, out2, . . . by the pixels 19A and 19B are inputted to the horizontal driving control circuit 53 in a unit of a line in accordance with the readout pulses ROUT1, ROUT2, . . . and then time division multiplexed by the horizontal driving control circuit 53. Further, after the signal level of the image pickup results are corrected by the succeeding amplification circuit 54, the image pickup results are converted into and outputted as digital signals by and from the analog/digital conversion circuit 55. Consequently, an image pickup result OUT is obtained for each of the pixel blocks 6 formed by dividing the image pickup surface, and the image pickup results OUT are outputted simultaneously and parallelly.

Further, the image pickup results OUT of the pixel blocks 6 are inputted individually to the corresponding pulse production blocks 43, by which the motion amounts ΔS of the pixel blocks 6 are determined. Then, based on the motion amounts ΔS, the electric charge accumulation time of the corresponding pixel blocks 6 is controlled such that the exposure time reduces as the motion amount of the pixel block increases.

Consequently, in the present image pickup apparatus, the exposure time can be controlled in response to a motion for each of blocks formed by dividing one screen image, and, regarding a stationary background, the exposure time can be set long to prevent degradation of the S/N ratio, but regarding a portion which involves some motion, the exposure time can be set short to prevent a blurred state. Further, by detecting a motion for each of blocks, a motion can be detected also from a small object, and as a result, a blurred state can be prevented also with regard to such a small object as described above. Consequently, regarding control of the exposure time by an electronic shutter, the picture quality is enhanced significantly in comparison with conventionally available picture quality.

Further, in the present image pickup apparatus, the exposure time is controlled in such a manner as described above to increase the gain of the amplification circuit 54 to correct the signal levels of the image pickup results OUT by an amount corresponding to an amount of reduction of the exposure time. Consequently, the exposure time can be controlled for each of the blocks in such a manner as described above to prevent the variation of the signal levels among the blocks, and degradation of the picture quality can be prevented thereby.

By controlling the exposure time for each of the pixel blocks in this manner, in the present image pickup apparatus, the image pickup results OUT are acquired for the individual pixel blocks 6 and outputted simultaneously and parallelly, and the motion amounts ΔS of the pixel blocks 6 are detected to control the exposure time by the pulse production blocks 43 individually corresponding to the pixel blocks 6. Consequently, in the present image pickup apparatus, the exposure time can be controlled for each of the blocks independently of each other by simultaneous and parallel processing for the plural blocks, and, as a result, the picture quality is enhanced by the easy process in comparison with conventionally available picture quality.

Particularly, in the present image pickup apparatus, the configuration that the sensor chip 2 and the logic chip 3 are connected and laminated by the micro bumps 31 and 32 such that the image pickup results OUT are acquired by the sensor chip 2 and the exposure time is controlled by the logic chip 3 to control the exposure time for each of the blocks by simultaneous and parallel processing of the plural blocks independently of each other in such a manner as described above can be applied to such a lamination structure of the sensor chip 2 and the logic chip 3 as described above to simplify the general configuration.

Further, in the sensor chip 2, by disposing the peripheral circuits such as the reset control circuit 52, horizontal driving control circuit 53 and so forth on the side opposite to the image pickup surface and laminating the peripheral circuits on the opposite side surface together with the logic chip 3, decrease of the numerical aperture of the pixels 19A and 19B can be avoided effectively, and further, crosstalk between the pixels 19A and 19B adjacent each other and so forth can be decreased. Further, the occupation area of the pixels 19A and 19B on the image pickup surface can be sufficiently secured, and, as a result, refinement of the pixels can be facilitated thereby to facilitate fabrication of the image pickup apparatus. Further, the degree of freedom in connection to the succeeding logic chip 3 can be enhanced significantly, and the degree of freedom in design can be enhanced as much.

By performing motion detection to control the exposure time in this manner, in the pulse production block 43, the averaging circuit 62 cumulatively sums the image pickup results OUT in a unit of a frame to determine an average value of the image pickup results OUT in each frame. Then, the succeeding frame difference calculation circuit 66 determines interframe differences of the average values to determine motion amounts $\Delta S$. Further, the shutter pulse production circuit 69 produces shutter pulses SHT from the motion amounts $\Delta S$, and the reset control circuit 52 produces reset pulses RST1, RST2, . . . from the shutter pulses SHT and varies the timings of the readout pulses ROUT1, ROUT2, . . . to vary the exposure times. Consequently, in the present image pickup apparatus, a motion amount $\Delta S$ is calculated by a simple and easy process of determining an interframe difference, and a process for exposure control is executed. Consequently, the exposure control process can be executed for each block by a simple and easy configuration.

(3) Effects of the First Embodiment

According to the configuration described above, by dividing one screen image into a plurality of blocks and performing motion detection for each of the blocks to control the exposure time for each block, the picture quality can be enhanced significantly in comparison with conventionally available picture quality with regard to control of the exposure time by an electronic shutter.

Further, at this time, by outputting image pickup results of the blocks simultaneously and parallelly and processing the image pickup results of the blocks to detect the motion amount for each of the blocks, the exposure time can be controlled by simultaneous and parallel processes which are independent of each other for each block. Consequently, the picture quality can be enhanced significantly in comparison with conventionally available picture quality regarding the control of the exposure time by an electronic shutter by simple and easy processes.

Further, by cumulatively summing image pickup results for each of the blocks in a unit of a frame to calculate average values and calculating interframe difference values of the average values to detect a motion amount for each of the blocks, the motion amount can be detected by a simple and easy configuration, and the general configuration can be simplified as much.

Further, by forming at least pixels of image pickup means, peripheral circuits to the pixels and a configuration of motion detection means on semiconductor chips different from one another and connecting them through micro bumps, the entire apparatus can be formed as an integrated circuit to simplify the configuration thereby to prevent decrease of the numerical aperture of the pixels and further assure the degree of freedom in design sufficiently.

(4) Second Embodiment

Figure 8:
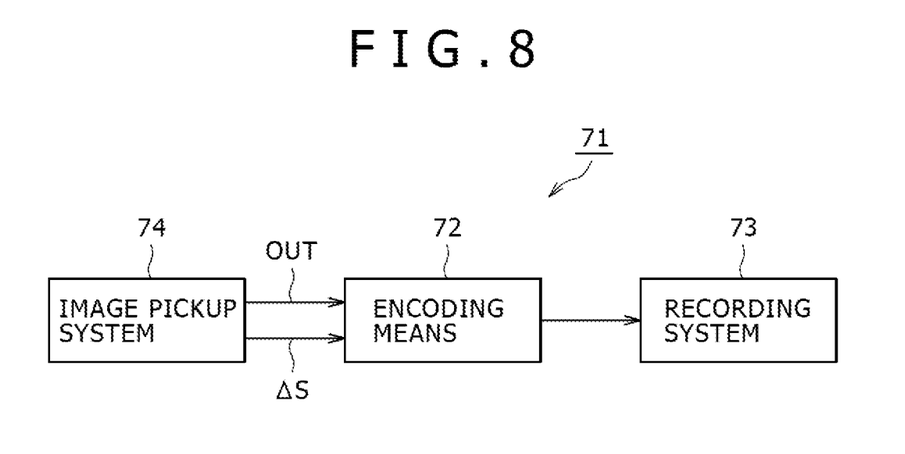
FIG. 8 is a block diagram showing an image pickup apparatus according to a second embodiment of the present invention.

As shown in FIG. 8, an image pickup apparatus 71 according to the present embodiment includes encoding means 72 and recording means 73 in addition to the configuration of the integrated circuit 1 described hereinabove in connection with the first embodiment. The encoding means 72 and the recording means 73 perform an encoding process for image pickup results OUT and record a result of the encoding process on a recording medium. Therefore, in the image pickup apparatus 71 according to the present embodiment, an image pickup system 74 is formed from the integrated circuit 1 described hereinabove in connection with the first embodiment, and image pickup results OUT outputted from the image pickup system 74 are multiplexed and then converted into and inputted as a luminance signal and a color difference signal to the encoding means 72. Then, resulting data of an encoding process by the encoding means 72 are recorded on the recording medium by the recording means 73.

Here, the encoding means 72 is encoding means relating to data compression in which a motion vector is used, and performs an encoding process of the image pickup results OUT using, for example, the technique of H.264.

On the other hand, the image pickup system 74 sets the number of pixels to form a pixel block 6 so as to correspond to a macro block to be used for detection of a motion vector by the encoding means 72. It is to be noted that, in this instance, a pixel block may be set so as to correspond to a macro block of one of the luminance signal and the color difference signal. Further, according to H.264, motion detection may be performed from a plurality of kinds of macro blocks of different sizes such that a pixel block is set so as to correspond to a macro block of one of the plural kinds of macro blocks.

Further, the image pickup system 74 sets the pixel blocks 6 in this manner and outputs motion amounts $\Delta S$ detected by the pixel blocks 6.

The encoding means 72 determines the motion amounts $\Delta S$ with a predetermined threshold value to determine presence or absence of a motion. Then, if it is determined as a result of the determination that a motion is involved, then a notion vector is detected by an ordinary process and an encoding process of the image pickup result OUT is performed. On the other hand, if it is determined as a result of the determination that no motion is involved, then detection of a motion vector is suspended and the motion vector is set to the value zero to perform an encoding process for the image pickup result OUT.

Consequently, in the present embodiment, a motion detection result used in control of the exposure time is utilized in an encoding process such that motion detection is performed for each block to control the exposure time, and the burden of the encoding process is moderated as much.

According to the present embodiment, by dividing image pickup results into blocks with a size corresponding to a detection unit of a motion vector in an encoding process and performing motion detection for each of the blocks to control the exposure time of each block and then utilizing results of the motion detection in the encoding process, the picture quality can be enhanced significantly in comparison with conventionally available picture quality regarding the control of the exposure time by an electronic shutter. Consequently, the burden involved in the encoding process can be reduced.

(5) Third Embodiment

Figure 9:
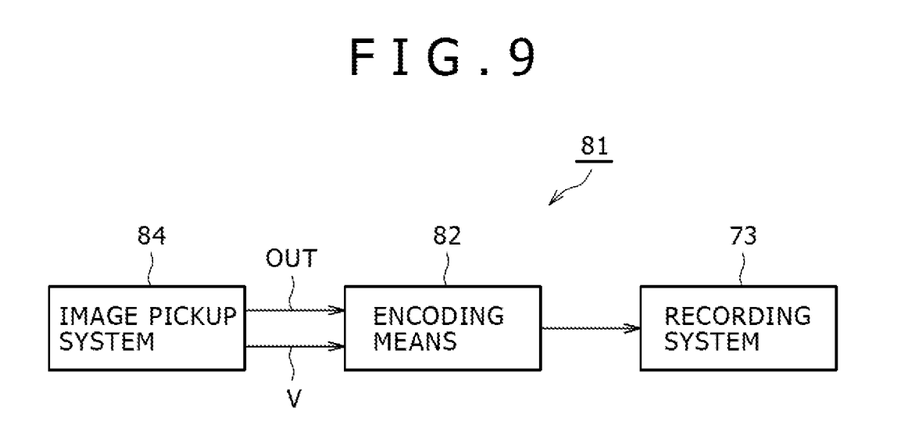
FIG. 9 is a block diagram showing an image pickup apparatus according to a third embodiment of the present invention.

As seen in FIG. 9 in contrast to FIG. 8, an image pickup apparatus 81 according to the present embodiment detects a motion amount by detection of a motion vector in place of detection of a motion amount by an interframe difference by the motion detection circuit 61 (refer to FIG. 4) of the image pickup system 74 described hereinabove in connection with the second embodiment. In particular, a motion vector V is detected, and this motion vector is converted into an absolute value to detect the length of the motion vector V, and then the magnitude of the motion is detected from the length of the motion vector V. It is to be noted, to the detection of the motion vector V, various detection methods such as a block matching method and a slope method can be applied.

Further, encoding means 82 suspends, in detection of a motion vector V regarding a block of a size corresponding to a pixel block 6, a detection process of a motion vector, and executes an encoding process using the motion vector V detected by the motion detection circuit 61. It is to be noted that the image pickup apparatus 81 is configured similarly to the image pickup apparatus 71 described hereinabove in connection with the second embodiment except such configurations which relate to a motion vector V as described above.

According to the present embodiment, similar effects to those of the second embodiment can be achieved also where a motion is detected using a motion vector to control the exposure time for each block.

(6) Other Embodiments

It is to be noted that, while, in the embodiments described above, the timings of both of a reset pulse and readout pulse are varied to control the exposure time, according to the present invention, the control of the exposure time is not limited to this, but the exposure time may be controlled by variation of the timing only of a reset pulse.

Further, while, in the embodiments described above, an image pickup result is outputted and processed for each pixel block, according to the present invention, outputting of an image pickup result is not limited to this, but image pickup results for one screen image may be outputted collectively and then classified and processed for each image block to control the exposure time for each of the pixel blocks. By this, even where an image pickup element of a conventional configuration which outputs image pickup results in accordance with an order of raster scanning is used in regard to outputting of image pickup results, the picture quality can be enhanced significantly in comparison with conventionally available picture quality regarding the control of the exposure time by an electronic shutter similarly as in the embodiments described hereinabove Further, while, in the embodiments described hereinabove, a sensor chip is formed from a CMOS solid-state image pickup element, the present invention is not limited to this but can be applied widely to a case wherein a sensor chip is formed from various solid-state image pickup elements according to the XY address system and another case wherein a sensor chip is formed from a CCD solid-state image pickup element.

Further, while, in the embodiments described hereinabove, the image pickup surface is divided in a horizontal direction and a vertical direction to form pixel blocks, according to the present invention, formation of pixel blocks is not limited to this, but the image pickup surface may be divided only in one of a horizontal direction and a vertical direction to form pixel blocks.

Further, while, in the embodiments described hereinabove, peripheral circuits to the pixels are provided on the rear surface side of the sensor chip 2 and laminated together with a logic chip, the present invention is not limited to this but can be applied widely also to a case wherein the peripheral circuits to the pixels are provided on the front surface side of the sensor chip 2, another case wherein a logic chip is formed as a separate member and so forth.

INDUSTRIAL APPLICABILITY

The present invention can be applied to an image pickup apparatus in which, for example, a CMOS solid-state image pickup element is used.

The invention claimed is:

1. An image pickup element comprising:
a first semiconductor substrate including an image pickup section having a plurality of pixel blocks; and
a second semiconductor substrate stacked on the first semiconductor substrate and including a signal processing circuit configured to process results of an image pickup for each of the pixel blocks from the image pickup section, the second semiconductor substrate including a plurality of pulse production blocks configured to control exposure time of the image pickup section,
wherein the pulse production blocks are electrically connected, respectively, to the pixel blocks, the pulse production blocks arranged over the pixel blocks,
wherein the second semiconductor substrate includes a motion amount detection circuit that uses the results of the image pickup of the pixel blocks output simultaneously and parallelly to individually detect the motion amount for each of the blocks,
in which the motion amount for each of the blocks is detected by cumulatively adding the results of the image pickup for each of the blocks in a unit of a frame to calculate an average value for each of the blocks and by calculating for each of the blocks an interframe difference value as a difference between, for a same block of the blocks, the average value calculated of a current frame and the average value calculated of a preceding frame.

2. The image pickup element of claim 1, wherein each of the pulse production blocks includes a shutter pulse production circuit configured to produce a shutter pulse and each of the pixel blocks includes a reset control circuit configured to receive the shutter pulse from the shutter pulse production circuit of the corresponding pulse production block.

3. The image pickup element of claim 2, wherein the shutter pulse production circuit of the corresponding pulse production block outputs the shutter pulse in accordance with a result of the motion amount detection.

4. The image pickup element of claim 2, wherein the reset control circuit is configured to output a gain control signal for an amplification circuit disposed in the corresponding pixel block in accordance with exposure time of the corresponding pixel block based on the shutter pulse.

5. The image pickup element of claim 3, wherein the motion amount detection circuit includes a frame difference calculation circuit configured to calculate the interframe difference values.

6. The image pickup element of claim 1 further comprising:
a connect unit including micro bumps connecting the pixels blocks to the corresponding pulse production blocks.

7. The image pickup element of claim 1, wherein each of the pixel blocks includes a signal level correction unit for correcting and outputting a signal level of a result of the image pickup for the pixel block which varies in accordance with control of exposure time for the pixel block.

8. The image pickup element of claim 1, wherein each of the pixel blocks includes an amplification unit to amplify a pixel signal for the pixel block based on an exposure time corresponding to the pixel block.

9. The image pickup element of claim 1, wherein the first semiconductor substrate includes a wiring layer positioned on a side opposite to an image surface of the image pickup section.

10. An image pickup apparatus comprising:
an imaging sensing unit including a first semiconductor substrate including an image pickup section having a plurality of pixel blocks; and
a control unit including a second semiconductor substrate, the second semiconductor substrate stacked on the first semiconductor substrate and including a signal processing circuit configured to process results of an image pickup for each of the pixel blocks from the image pickup section, the second semiconductor substrate including a plurality of pulse production blocks configured to control exposure time of the image pickup section,
wherein the pulse production blocks are electrically connected, respectively, to the pixel blocks, the pulse production blocks arranged over the pixel blocks
wherein the second semiconductor substrate includes a motion amount detection circuit that uses the results of the image pickup of the pixel blocks output simultaneously and parallelly to individually detect the motion amount for each of the blocks,
in which the motion amount for each of the blocks is detected by cumulatively adding the results of the image pickup for each of the blocks in a unit of a frame to calculate an average value for each of the blocks and by calculating for each of the blocks an interframe difference value as a difference between, for a same block of the blocks, the average value calculated of a current frame and the average value calculated of a preceding frame.

11. The image pickup apparatus of claim 10, wherein each of the pulse production blocks includes a shutter pulse production circuit configured to produce a shutter pulse and each of the pixel blocks includes a reset control circuit configured to receive the shutter pulse from the shutter pulse production circuit of the corresponding pulse production block.

12. The image pickup apparatus of claim 11, wherein the shutter pulse production circuit of the corresponding pulse production block outputs the shutter pulse in accordance with a result of the motion amount detection.

13. The image pickup apparatus of claim 11, wherein the reset control circuit is configured to output a gain control signal for an amplification circuit disposed in the corresponding pixel block in accordance with the exposure time of the corresponding pixel block based on the shutter pulse.

14. The image pickup apparatus of claim 12, wherein the motion amount detection circuit a frame difference calculation circuit configured to calculate the interframe difference values.

15. The image pickup apparatus of claim 10 further comprising:
a connect unit including micro bumps connecting the pixels blocks to the corresponding pulse production blocks.

16. The image pickup apparatus of claim 10, wherein each of the pixel blocks includes a signal level correction unit for correcting and outputting a signal level of a result of the image pickup for the pixel block which varies in accordance with control of exposure time for the pixel block.

17. The image pickup apparatus of claim 10, wherein each of the pixel blocks includes an amplification unit to amplify a pixel signal for the pixel block based on an exposure time corresponding to the pixel block.

18. The image pickup apparatus of claim 10, wherein the first semiconductor substrate includes a wiring layer positioned on a side opposite to an image surface of the image pickup section.

* * * * *